(12) United States Patent
Matsukawa et al.

(10) Patent No.: US 11,026,021 B2
(45) Date of Patent: Jun. 1, 2021

(54) HYBRID SPEAKER AND CONVERTER

(71) Applicant: Sony Interactive Entertainment Inc., Tokyo (JP)

(72) Inventors: Takeo Matsukawa, San Jose, CA (US); Jaekwon Yoo, Castro Valley, CA (US)

(73) Assignee: Sony Interactive Entertainment Inc., Tokyo (JP)

( * ) Notice: Subject to any disclaimer, the term of this patent is extended or adjusted under 35 U.S.C. 154(b) by 120 days.

(21) Appl. No.: 16/279,896

(22) Filed: Feb. 19, 2019

(65) Prior Publication Data
US 2020/0267473 A1   Aug. 20, 2020

(51) Int. Cl.
*H04R 3/04* (2006.01)
*H04R 1/32* (2006.01)
*H04R 1/22* (2006.01)
*H03F 3/181* (2006.01)
*H04R 13/00* (2006.01)

(52) U.S. Cl.
CPC ............... *H04R 3/04* (2013.01); *H03F 3/181* (2013.01); *H04R 1/22* (2013.01); *H04R 1/323* (2013.01); *H04R 13/00* (2013.01)

(58) Field of Classification Search
CPC . H04R 3/04; H04R 13/00; H04R 1/22; H04R 1/323; H03F 3/181
See application file for complete search history.

(56) References Cited

U.S. PATENT DOCUMENTS

| | | | |
|---|---|---|---|
| 9,197,963 B1* | 11/2015 | North | H04R 5/02 |
| 2009/0202099 A1* | 8/2009 | Hsu | H04S 7/00 |
| | | | 381/387 |
| 2010/0208932 A1* | 8/2010 | Liou | H04R 1/403 |
| | | | 381/387 |
| 2014/0241552 A1* | 8/2014 | Takeda | H04R 1/323 |
| | | | 381/307 |

FOREIGN PATENT DOCUMENTS

WO     2020171996     8/2020

OTHER PUBLICATIONS

Pascual, Santiago. "SEGAN: Speech Enhancement Generative Adversarial Network". pp. 1-5. Published Jun. 9, 2017.*
Patent Cooperation Treaty; International Search Report issued in PCT Application No. PCT/US20/17471, dated Apr. 23, 2020; 3 pages.

(Continued)

*Primary Examiner* — Brian Ensey
(74) *Attorney, Agent, or Firm* — Fitch, Even, Tabin & Flannery LLP

(57) ABSTRACT

An audio converter system is provided. The system comprises an audio input configured to receive a source audio, an audio output configured to couple to a hybrid speaker comprising at least two nondirectional speakers and a directional speaker, and a processor configured to generate an output audio for the hybrid speaker based on the source audio by: identifying a specific sound in the source audio, isolating the specific sound from the source audio, generating a directional speaker output for the directional speaker of (Continued)

the hybrid speaker based on the specific sound, and generating at least two channels of nondirectional speaker output for the at least two nondirectional speakers of the hybrid speaker.

25 Claims, 4 Drawing Sheets

(56) References Cited

OTHER PUBLICATIONS

Patent Cooperation Treaty; Written Opinion of the International Searching Authority issued in PCT Application No. PCT/US20/17471, dated Apr. 23, 2020; 17 pages.
Patent Cooperation Treaty; Notification of Transmittal of the International Search Report and the Written Opinion of the International Searching Authority issued in PCT Application No. PCT/US20/17471, dated Apr. 23, 2020; 1 page.

* cited by examiner

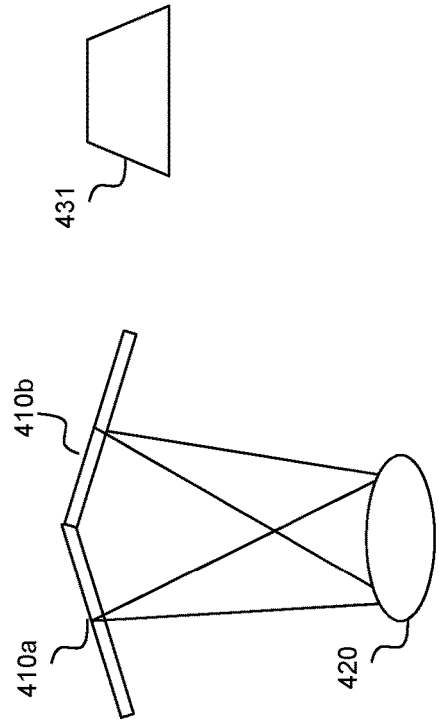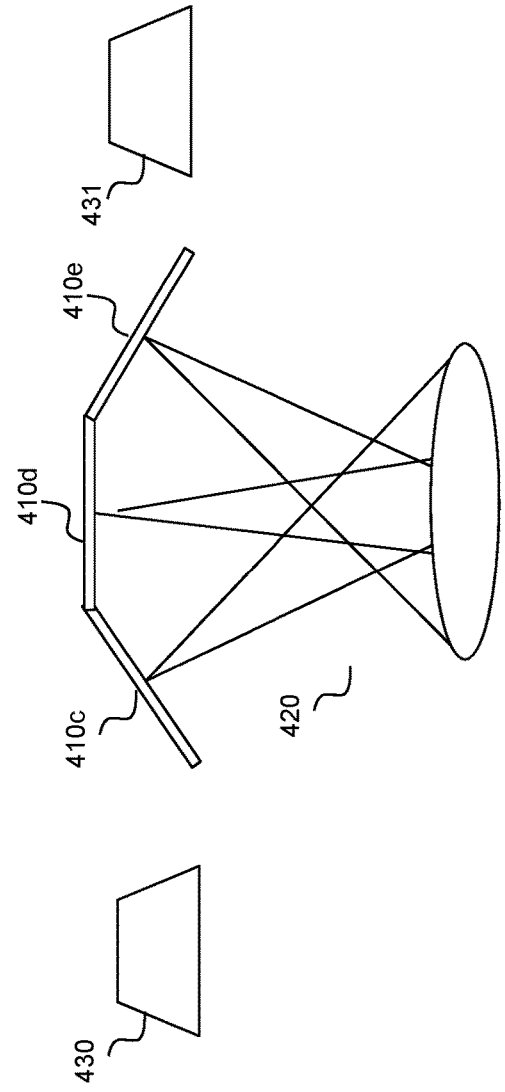

HYBRID SPEAKER AND CONVERTER

BACKGROUND OF THE INVENTION

1. Field of the Invention

The present invention relates generally to audio processing, and more specifically to generating audio signal for directional speakers.

2. Discussion of the Related Art

A loudspeaker (or speaker) is an electroacoustic transducer which converts an electrical audio signal into a corresponding sound. In a conventional dynamic cone speaker, for example, a coil of wire is suspended in a circular gap between the poles of a permanent magnet. When an alternating current electrical audio signal is applied, the coil is forced to move rapidly back and forth due to Faraday's law of induction, which causes a diaphragm attached to the coil to move back and forth, pushing on the air to disperse sound waves around the diaphragm.

SUMMARY OF THE INVENTION

One embodiment provides a system comprising an audio input configured to receive a source audio, an audio output configured to couple to a hybrid speaker comprising at least two nondirectional speakers and a directional speaker, and a processor configured to generate an output audio for the hybrid speaker based on the source audio by identifying a specific sound in the source audio, isolating the specific sound from the source audio, generating a directional speaker output for the directional speaker of the hybrid speaker based on the specific sound, and generating at least two channels of nondirectional speaker output for the at least two nondirectional speakers of the hybrid speaker.

Another embodiment provides a method comprising identifying, with a processor, a specific sound in a source audio, isolating the specific sound from the source audio, generating a directional speaker output for a directional speaker of a hybrid speaker based on the specific sound, and generating at least two channels of nondirectional speaker output for at least two nondirectional speakers of the hybrid speaker.

Another embodiment provides an audio speaker apparatus comprising a speaker housing, a left nondirectional speaker and a right nondirectional speaker enclosed in the speaker housing, and a directional speaker positioned between the left nondirectional speaker and the right nondirectional speaker and enclosed in the speaker housing.

A better understanding of the features and advantages of various embodiments of the present invention will be obtained by reference to the following detailed description and accompanying drawings which set forth an illustrative embodiment in which principles of embodiments of the invention are utilized.

BRIEF DESCRIPTION OF THE DRAWINGS

The above and other aspects, features and advantages of embodiments of the present invention will be more apparent from the following more particular description thereof, presented in conjunction with the following drawings wherein:

FIG. 4A and FIG. 4B are illustrations of directional speakers with a plurality of panels in accordance with some embodiments of the present invention.

DETAILED DESCRIPTION

Directional speakers generally refer to devices that create a field of sound that spread less than traditional speakers. In some embodiments, a directional speaker may comprise a parametric array speaker that creates sound from ultrasound. Directional speaker devices achieve high directivity by modulating audible sound onto high-frequency ultrasound. The higher frequency sound waves have a shorter wavelength and thus do not spread out as rapidly, thus resulting in directivity that is higher than conventional nondirectional loudspeakers.

In some embodiments described herein, a directional speaker is combined with one or more conventional nondirectional speakers to simulate immersive sound and/or to selectively project select sound to specific user(s) in a room. In some embodiments, the directional and nondirectional speakers may be enclosed in the same housing to provide a hybrid soundbar. In some embodiments, a converter is provided to convert conventional audio file and/or stream to signals for driving a hybrid speaker. The converter may be configured to identify and isolate specific sound to be reproduced by the directional speaker and generate outputs for the directional and nondirectional speakers in the speaker assembly.

Figure 1:
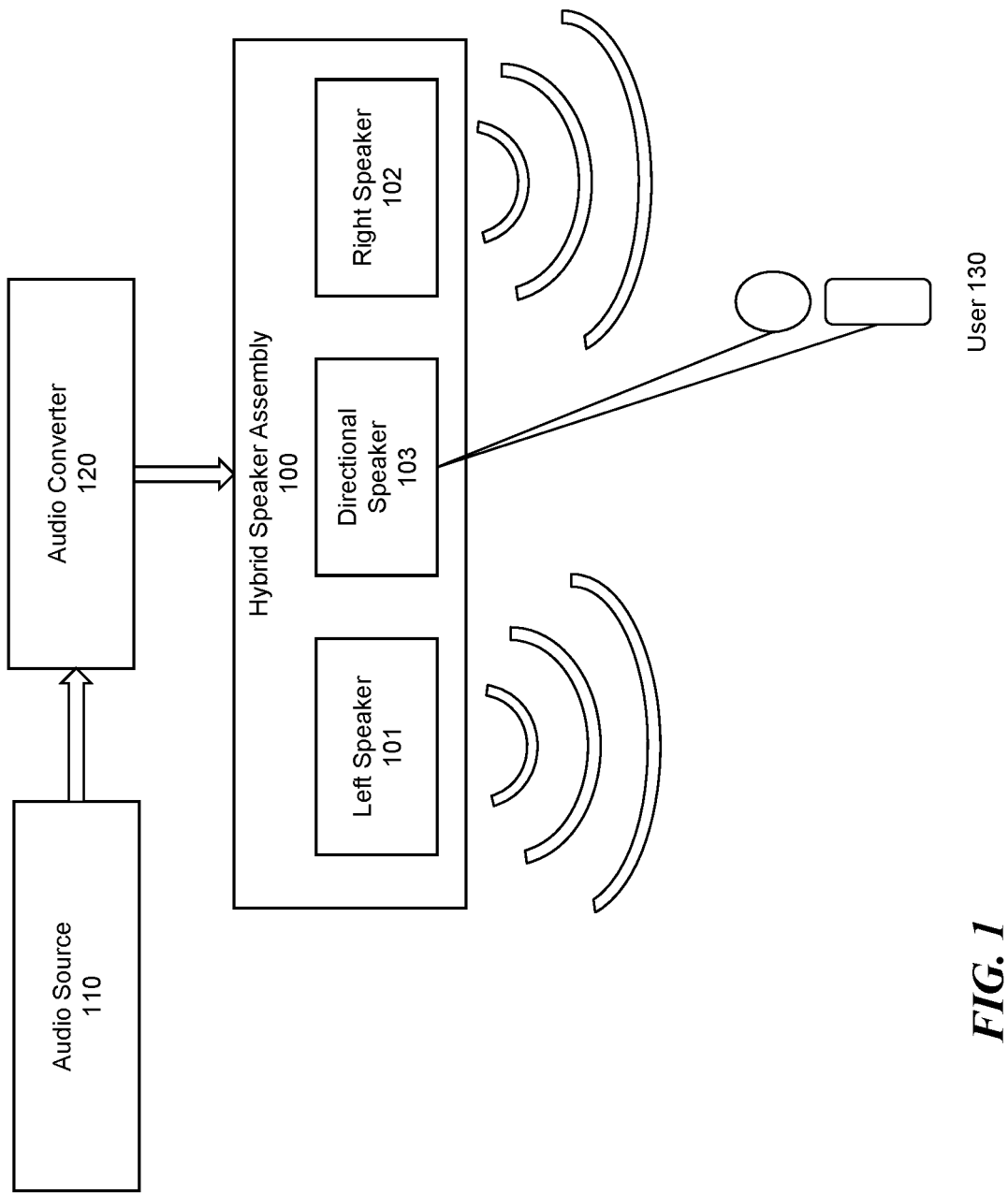
FIG. 1 is a block diagram illustrating a system for driving a hybrid speaker in accordance with some embodiments of the present invention.

Referring first to FIG. 1, there is shown a system for driving a hybrid speaker. The system comprises an audio source 110, an audio converter 120, and a hybrid speaker assembly 100 producing sound for a user 130.

The audio source 110 generally refers to a device that outputs a sound for playback at one or more speakers. In some embodiments, the audio source 110 may comprise a playback device such as a television, a cable box, a media player, a hard drive, a media storage device, a home entertainment system, a computer, a game console, a mobile device, and the like. The audio source 110 may output mono sound, stereo sound, and/or surround sound. In some embodiments, the audio source 110 may output one or more nondirectional audio channels. In some embodiments, the audio source 110 may output any number of audio channels, such as two channels (e.g. left/right stereo sound), three channels (e.g. center, left, and right), six channels (e.g. 5.1 surround), eight channels (e.g. 7.1 surround), etc.

The audio converter 120 comprises a device configured to convert audio signal from the audio source 110 to signals configured to drive directional and nondirectional speakers of the hybrid speaker assembly 100. In some embodiments, the audio converter 120 is configured to take one or more conventional audio channels and generate at least one output channel for a directional speaker 103. In some embodiments, the audio converter 120 comprises a processor configured to identify a specific sound in the source audio, isolate the specific sound from the source audio, generate a directional speaker output for the directional speaker of the hybrid speaker based on the specific sound, and generate at least two channels of nondirectional speaker output for the at least two nondirectional speakers of a hybrid speaker. In some embodiments, the audio converter 120 may further comprise a sound database for identifying a specific sound in the source audio. In some embodiments, the sound database may comprise a cloud database that is shared among a plurality of audio converter 120 and accessible via a network adapter on the audio converter 120 configured to communicate over a network such as a home network and/or the Internet. In some embodiments, the audio converter 120 may be configured to run a machine learning algorithm for identifying the specific sound based on a growing and evolving learning set of sounds stored in the sound database. Further details of the audio converter 120 are provided with reference to FIGS. 2 and 3 herein.

The hybrid speaker assembly 100 generally refers to a speaker device comprising at least one directional and one or more nondirectional speakers. In the embodiment shown in FIG. 1, the hybrid speaker comprises a left nondirectional speaker and a right nondirectional speaker enclosed in the speaker housing and a directional speaker positioned between the left nondirectional speaker and the right nondirectional speaker. In some embodiments, the hybrid speaker assembly 100 may comprise the form factor of a soundbar. In some embodiments, a hybrid speaker assembly 100 may comprise two or more separately movable housings.

The left speaker 101 and the right speaker 102 comprise nondirectional speakers. Nondirectional speaker generally refers to conventional speakers which have a large spread and small directionality. For example, the sound produced by a nondirectional speaker may generally be similarly audible to listeners positioned in any direction relative to the speaker. In some embodiments, the left speaker 101 and the right speaker 102 may comprise a dynamic loudspeaker comprising a diaphragm connected to a frame via a flexible suspension that constrains a voice oil. In some embodiments, the left speaker 101 and the right speaker 102 may comprise speaker elements similar to those in a conventional soundbar. In some embodiments, the hybrid speaker assembly 100 may comprise additional nondirectional speakers such as a center speaker, a subwoofer, and the like.

The directional speaker 103 generally refers to a speaker device with a narrow spread and high directionality. Generally, sound projected by a directional speaker is only audible within a specific direction relative to the speaker. In some embodiments, the directional speaker 103 may be configured to carry audible sound wave on inaudible high-frequency waveform (e.g. ultrasound). In some embodiments, the directional speaker 103 may comprise a parametric array speaker that creates sound from ultrasound.

In some embodiments, the directional speaker 103 may comprise a plurality of fixed panels. For example, the directional speaker 103 may comprise two or more fixed parametric array panels that are angled relative to each other. An example of a two-panel directional speaker configuration is shown in FIG. 4A and an example of a three-panel directional speaker configuration is shown in FIG. 4B. The panels of the directional speaker 103 may be separately controlled to affect the overall projection direction of the directional speaker 103. For example, the outputs of each panel may be modulated to cause the projection direction of the directional speaker 103 to sweep across multiple angles in a projection area to selectively direct sound at different intended directions. In some embodiments, the sweep may be performed at a speed that is recognizable by human ears. In some embodiments, the speed sweep may be between 0.01 Hz to 10 Hz or faster.

The projection angles controlled by modulating the output of the different panels may also be used to separately direct sound towards two or more listeners sitting apart and/or create simulated surround sound effect by projecting different sound towards the left and right ears of a listener. In some embodiments, each panel of the directional speaker 103 may be driven by a separate audio stream outputted from the audio converter 120. In some embodiments, the hybrid speaker assembly 100 and/or the audio converter 120 may be configured to convert audio and projection direction data into audio output for each panel of the directional speaker 103. For example, sound modulation may process a sound signal dynamically over time. using phase shifts and/or amplitude control to provide the sound effect by sweeping the signal from left/right to right/left.

In some embodiments, the directional speaker 103 may comprise a mechanical rotor configured to physically rotate the directional speaker 103 to control the projection direction of the speaker. For example, the rotor may turn a parametric array towards the user 130 to direct the sound to the user. In some embodiments, the rotor may sweep the projection direction of the directional speaker 103 across a projection area, and the directional speaker 103 may only produce sound at intended angles during the rotation such that a single directional speaker may be perceived to project sound at multiple discrete or continuous directions. For example, the directional speaker 103 may direct different sounds to different listeners sitting apart in a room by timing the output audio to the rotation. In another example, the directional speaker 103 may direct different sounds toward the left and right ears of a user to simulate surround or immersive sound. In some embodiments, the directional speaker 103 is driven by a signal that comprises audio and projection direction data associated with one or more temporal portions of audio, and the rotor may be controlled by the projection direction data associated with the audio signal.

While only one directional speaker 103 is shown in the hybrid speaker assembly 100, in some embodiments, the hybrid speaker assembly 100 may comprise a plurality of directional speakers 103 driven by different input. For example, the hybrid speaker may comprise two or more parametric arrays mounted on separate rotors and/or a plurality of sets of parametric array panels. While the audio converter 120 is shown separately from the hybrid speaker assembly 100, in some embodiments, the audio converter 120 may be integrated into the housing of the hybrid speaker assembly 100 as one physical device. In some embodiments, the audio converter 120 may be local to the hybrid speaker assembly 100 and/or comprise a cloud-based and/or server-based converter. In some embodiments, the audio converter 120 may be integrated with an audio source 110, such as a home entertainment console, a game console, a computer system, and the like. The audio source 110 may selectively engage the audio converter 120 based on the audio format (e.g. conventional audio or hybrid speaker ready audio format) and/or the speaker device coupled to the audio source 110 (e.g. conventional speaker or hybrid speaker).

With the system shown in FIG. 1, a conventional audio source 110 may be converted, via the audio converter 120, to signal for driving a hybrid speaker assembly 100 comprising a directional speaker 103. With a single user 130, the directional speaker 103 may direct different sound to the left and right sides of the user that is mixed with the output from the conventional speakers to simulate surround and/or immersive sound effect. In some embodiments, the directional speaker 103 may be configured to project sounds only audible to specific listener(s) in a projection area while the conventional speakers generate sounds audible to all listeners. For example, in a multiplayer game, different specific sounds (e.g. voice instructions, status alerts, warnings) may be projected to different players while ambient sound or background music may be played through the nondirectional speakers.

In some embodiments, the hybrid speaker assembly 100 may be used without the audio converter 120. In some embodiments, an audio source 110 may output audio configured for a hybrid speaker assembly 100 comprising directional and nondirectional speaker signals and the audio converter 120 may be omitted. A hybrid speaker compatible game console, for example, may output select sound files (e.g. voice instructions, status alerts, warnings) via a directional speaker channel and the remaining sound files (e.g. background music) via one or more nondirectional speaker channel in its audio output. In another example, prerecorded audio (e.g. movie, music, etc.) may be recorded with at least one directional audio channel that can be directly used by a hybrid speaker without conversion.

Figure 2:
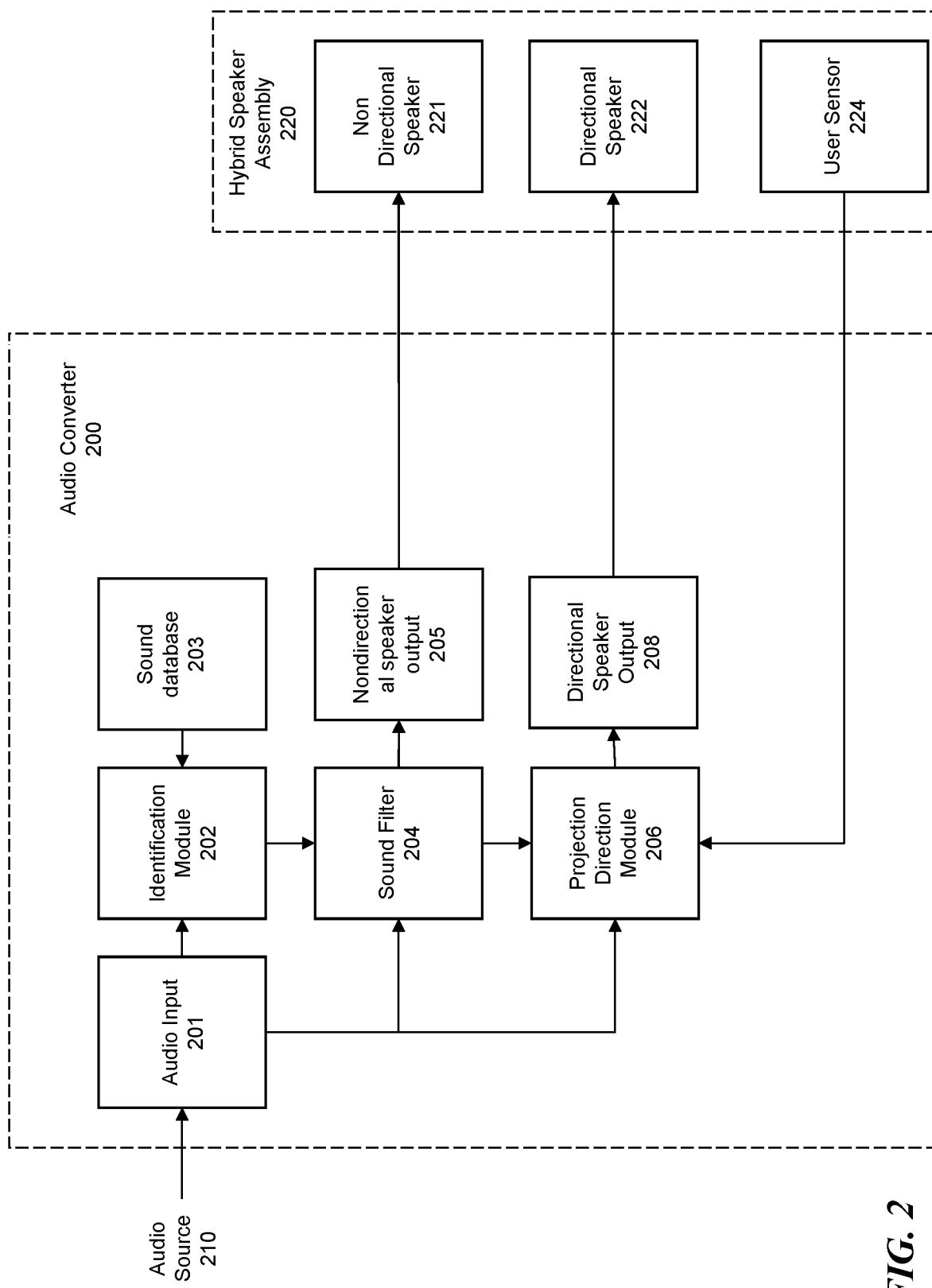
FIG. 2 is a block diagram illustrating a system for converting audio for a hybrid speaker in accordance with some embodiments of the present invention.

Referring next to FIG. 2, there is shown a system for converting audio source for use by a hybrid speaker. The audio converter 200 is generally configured to take signals from an audio source 210 and output signals to the nondirectional speaker 221 and the directional speaker 222 of a hybrid speaker assembly 220. In some embodiments, the audio source 210, the audio converter 200, and the hybrid speaker assembly 220 may comprise the audio source 110, the audio converter 120, and the hybrid speaker assembly 100 described with reference to FIG. 1 herein.

The audio converter 200 comprises an audio input 201, an identification module 202, a sound database 203, a sound filter 204, a nondirectional speaker output 205, a projection direction module 206, and a directional speaker output 208.

The audio input 201 is generally configured to receive analog or digital audio signal from an audio source 210. The audio input 201 may comprise wired and/or wireless connectors such as an audio connector, an audio/video connector, an HDMI connector, a USB connector, a Bluetooth transceiver, a wireless HDMI transceiver, and the like. In some embodiments, the audio input 201 may further comprise other components for filtering, converting, and/or boosting the input signal for the rest of the circuitry for processing.

The identification module 202 is generally configured to identify a specific sound in the input audio for playback through the directional speaker. The identification module 202 may be implemented on a processor, a control circuit, an application specific integrated circuit (ASIC), and/or one or more digital or analog audio filter components. In some embodiments, the specific sound is identified by comparing the source audio with sound clips and/or sound profiles in a sound database 203. For example, the sound database 203 may comprise sound clip and/or sound profiles (e.g. frequency spectrum characteristics, frequency distribution, temporal frequency or amplitude changes, etc.) associated with a plurality of types of sounds suitable for playback via a directional speaker. Examples of such sound may include car sounds, bird sounds, ballistic projectile sounds, human speech, alerts, warning sounds, and the like. In some embodiments, the identification module 202 may comprise audio event detection algorithms which utilizes convolutional neural network (CNN), recurrent neural network (RNN), and/or generative adversarial network (GAN) that identify specific sounds through machine learning using sounds in the sound database 203 as a learning set. In some embodiments, listener response may be used as feedback to the machine learning algorithm. In some embodiments, other types of feedback used for machine learning may comprise camera input, face detection/tracking, and/or object detection/tracking. In some embodiments, user and environmental feedback may be used in direction and volume control. In some embodiments, the specific sound may be identified based on frequency, amplitude, and/or duration. For example, the sound identification module 202 may be configured to detect sounds with high frequency and short duration as specific sound for playback via a directional speaker. In some embodiments, the specific sound may be identified based on at least one of sound frequency and amplitude difference between two or more channels of the source audio. For example, if a sound within the sound stream is louder (e.g. having interaural intensity difference (IID) or time delayed (e.g. having interaural time difference (ITD)) between the left or right speaker channels, the identification module may identify the sound associated with significant IID or ITD for playback at the directional speaker. In some embodiments, a sound may be initially identified based on IID and/or ITD and added to the sound database 203. The identification module 202 may then use the sound samples in the sound database 203 to identify similar sounds in the source audio that may not have significant IID and/or ITD.

In some embodiments, the sound database 203 may comprise a local and/or a network-based database storing audio clips and/or sound profiles. In some embodiments, the sound database 203 may be maintained by a central service shared among a plurality of audio converters 200 associated with different users and different spaces. In some embodiments, the sound database 203 may be updated and pruned by machine learning algorithm such as a generative adversarial network (GAN) using audio and feedback received at a plurality of audio converters. In some embodiments, the audio converter 200 may comprise a network interface (e.g. network adapter, wireless transceiver, etc.) for communicating with a network-based sound database 203. In some embodiments, at least a portion of the function of the identification module 202 and the sound filter 204 may be carried out by a remote server via the network interface.

The sound filter 204 is configured to isolate the specific sound identified by the identification module 202 from the other sounds in the audio source 210. In some embodiments, the sound filter 204 may use temporal filtering, amplitude filtering, and/or frequency filtering such as high, low, or band filtering to isolate the sound. In some embodiments, the sound filter 204 may use the difference between different channels of the audio source 210 to isolate the specific sound. For example, if a high degree of ITD or IID is detected between channels of the input audio stream, one channel may be used to isolate the specific sound in another channel by subtraction or masking. In some embodiments, the filtering may only approximate isolation of the specific sound; as sound from the directional speaker's would be mixed with the sound from the nondirectional speaker during playback, incomplete isolation may not significantly affect user experience. In some embodiments, a sound from the sound database 203 that matched the specific sound may be used to filter the sound and/or recreate the specific sound. The sound filter 204 then provides the specific sound isolated from the input audio to the projection direction module 206 and the directional speaker output 208. The sound filter 204 may further subtract the specific sound from one or more channels of the source audio and output the modified nondirectional audio signal to the nondirectional speaker(s)

221 of the hybrid speaker. In some embodiments, the source audio may be provided to the nondirectional speakers 221 without modification.

The nondirectional speaker output 205 is generally configured to couple to the hybrid speaker assembly 220 and provide audio signal for playback at the nondirectional speaker(s) 221. In some embodiments, the nondirectional speaker output 205 may comprise wired and/or wireless connectors such as an audio connector, an audio/video connector, an HDMI connector, a USB connector, a Bluetooth transceiver, a wireless HDMI transceiver, and the like. In some embodiments, the nondirectional speaker output 205 may further comprise other components for providing the signal to the speaker such as an amplifier, a digital to analog converter and the like. In some embodiments, the nondirectional speaker output 205 may output a plurality of channels each corresponding to a nondirectional speaker (e.g. right speaker, left speaker) of the hybrid speaker assembly 220 via a single wire, multiple wires, or a wireless connection.

The projection direction module 206 is configured to determine a projection direction associated with the output to the directional speaker 222. In some embodiments, the projection direction module 206 determines a projection direction based on one or more of a user location and a time delay or/or amplitude difference between two or more channels of the source audio. In some embodiments, the projection direction may be determined based on the user's location detected by a user sensor 224 on the hybrid speaker assembly 220 and/or on the audio converter 200 such that the directional speaker projects the specific sound towards one or more users. In some embodiments, user location and/or projection area may be determined through a speaker calibration process. In some embodiments, the projection direction module 206 may be determined based on the amplitude (e.g. loudness) difference of the specific sound in the two or more channels (IID) of the source audio and/or the time delay difference of the specific sound between the two or more channels of the source audio (ITD). For example, if the specific sound is significantly louder on the left channel, the projection direction of the directional speaker 222 may be angled to the left. In another example, if the amplitude and timing of the specific sound are substantially the same in both channels, the projection direction of the directional speaker 222 may be directed towards the center. In some embodiments, the projection direction module 206 may determine a 2D soundscape to be outputted by the directional speaker 222 and determine sound to be outputted at each angle as the directional speaker 222 sweeps through the projection area of the 2D soundscape. In some embodiments, the directional speaker 222 may be configured sweep through the soundscape space in a fixed pattern, and the projection direction module 206 is configured to time the audio signal output to the sweep position of the directional speaker 222 to output the 2D soundscape. In some embodiments, an optical sensor may be used to detect user location and user detection/tracking information may be used to determine projection direction. In some embodiments, user location may be determined through a calibration process and/or be manually adjusted by a user.

The directional speaker output 208 is generally configured to couple to the hybrid speaker and provide a signal for playback at the directional speaker(s) 222 of the hybrid speaker assembly 220. In some embodiments, the directional speaker output 208 may comprise wired and/or wireless connectors such as an audio connector, an audio/video connector, an HDMI connector, a USB connector, a Bluetooth transceiver, a wireless HDMI transceiver, and the like. In some embodiments, the directional speaker input 201 may further comprise other components for providing the signal to the speaker such as an amplifier, a digital to analog converter, and the like. In some embodiments, the output signal may comprise audio signals synchronized to the sweep of the directional speaker 222. In some embodiments, the output signal may comprise one or more projection angles each associated with a temporal portion of an audio stream. For example, the audio output may specify that the first 2 nanoseconds of audio is to be projected at 35 degrees, and the next 3 nanoseconds of audio is to be projected at 50 degrees. In some embodiments, the output signal may comprise an audio stream and a directional speaker movement instruction timed to the audio stream. For example, directional speaker movement instruction may specify the speed of the sweep, the range of the sweep, etc. In some embodiments, for a directional speaker 222 with a mechanical rotor, the audio converter may output a rotor control signal separately from the audio stream. In some embodiments, for a directional speaker 222 with a plurality of fixed panels, the output signal may comprise separate audio channels to be outputted at each of the panels of the directional speaker 222 that is modulated to control the projection direction of the directional speaker 222. In some embodiments, the output signal may comprise a 2D soundscape for playback by the directional speaker 222 and the hybrid speaker assembly 220 may comprise a processor configured to control the projection direction and the audio output of the directional speaker 222 to reproduce the 2D soundscape.

In some embodiments, the outputs from the nondirectional speaker output 205 and directional speaker output 208 are timed such that the outputs from the nondirectional speaker 221 and the directional speaker 222 are synchronized and mixed when the sounds for each speaker device reach the listener. In some embodiments, machine learning such as GAN may be applied to selectively mix and synchronize the output to the nondirectional speaker 221 and the directional speaker 222 using the sound database 203.

In some embodiments, one or more functions of the projection direction module 206 described herein may be carried out by the hybrid speaker assembly 220 instead. For example, in embodiments where the directional speaker 222 is configured to project the specific sound based solely on user location, the directional speaker output 208 may only output the specific sound and the hybrid speaker assembly 220 may determine the projection direction based on the user location detected by the user sensor 224. In such case, the user sensor 224 may not provide user location information to with the audio converter 200 and the projection direction module 206 may be omitted on the audio converter 200.

The user sensor 224 is generally configured to detect the location of one or more listeners near the directional speaker. In some embodiments, the user sensor 224 may comprise an optical sensor, a microphone, a sonic sensor, an ultrasound sensor, a thermal sensor, and the like. In some embodiments, the user location may be determined by detecting for sound reflection from a sound produced by the directional speaker. For example, the directional speaker 222 may sweep a projection area with directional sound and a user sensor 224 comprising a microphone may measure the timing of sound reflection at each angle to determine the presence and/or location of user(s).

In some embodiments, the connection between the audio converter 200 and the hybrid speaker assembly 220, while shown with multiple arrows, may comprise a single wire or a wireless connection. In some embodiments, the audio converter 200 and the hybrid speaker assembly 220 may be an integrated device enclosed in a single housing. In some embodiments, the audio converter 200 may be integrated with an audio source 210 that selectively engaged the audio converter based on audio format and/or speaker type.

Figure 3:
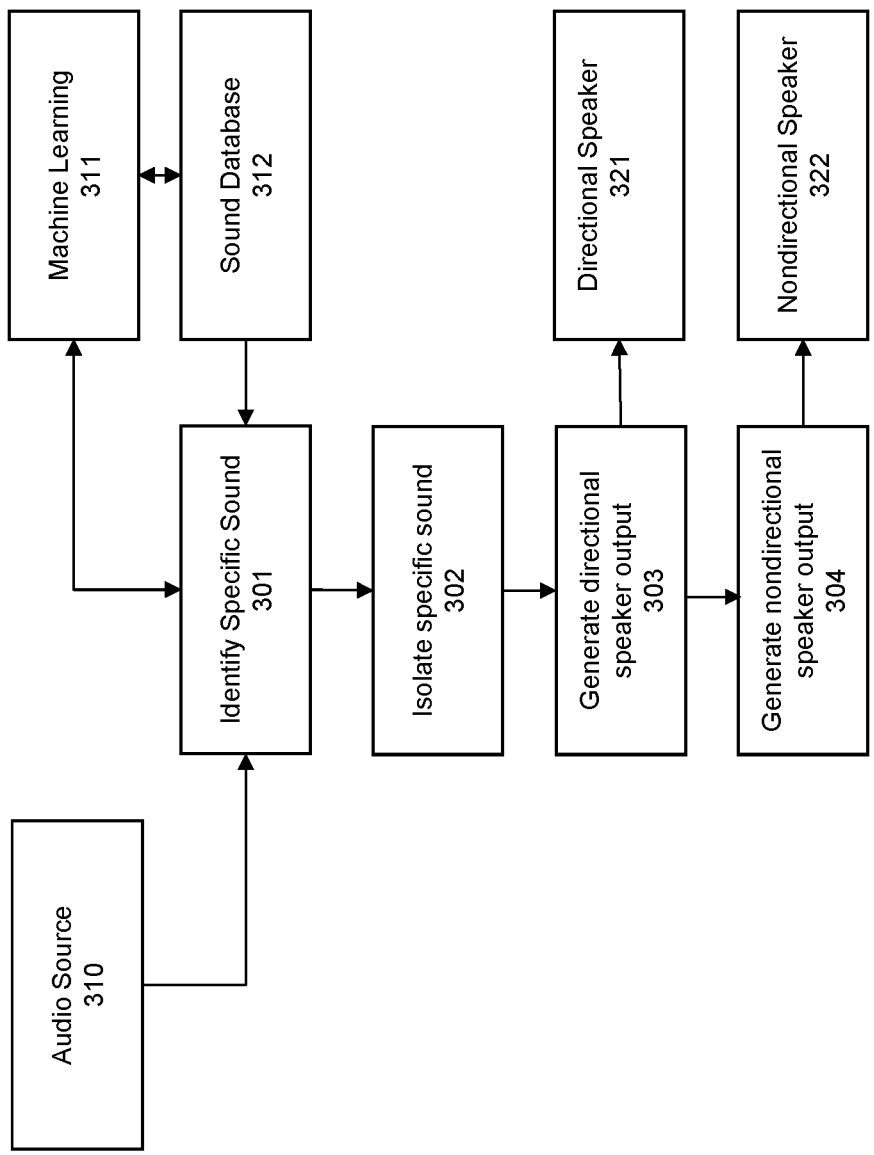
FIG. 3 is a flow diagram showing a method for converting source audio for a hybrid speaker in accordance with some embodiments of the present invention.

Referring next to FIG. 3, there is illustrated an example of a method for converting audio for a hybrid speaker. In some embodiments, the steps shown in FIG. 3 may be performed by one or more of an audio converter, a hybrid speaker controller, a computer system, and a server. In some embodiments, one or more the steps shown in FIG. 3 may be performed by the audio converter 120 and/or the hybrid speaker assembly 100 described with reference to FIG. 1 and/or the audio converter 200 and/or the hybrid speaker assembly 220 described with reference to FIG. 2 herein. Generally, the steps in FIG. 3 may be performed by one or more processor-based devices comprising a control circuit and a memory storing a set of computer-executable instructions.

In step 301, the system identifies a specific sound in audio provided from the audio source 310. The specific sound generally refers to a sound that is selected for playback through the directional speaker. In some embodiments, the specific sound is identified by comparing the source audio with sounds and/or sound profiles in a sound database 312. In some embodiments, the specific sound is identified through machine learning algorithm 311 using the sound database 312 as a learning set. In some embodiments, the machine learning algorithm 311 may comprise a generative adversarial network (GAN). In some embodiments, the specific sound is identified based on one or more of the frequency, the tone, and the amplitude of the sound. In some embodiments, the sound database 312 may comprise sound clip and/or sound profiles (e.g. frequency spectrum characteristics, frequency distribution, temporal frequency or amplitude changes, etc.) associated with a plurality of types of sounds suitable for playback via a directional speaker. Examples of such sounds may include car sounds, bird sounds, ballistic projectile sounds, human speech, alerts, warning sounds, and the like. In some embodiments, a sound may be initially identified based on frequency, duration, amplitude, and/or IID and/or ITD between two or more channels of the source audio and added to the sound database 312. The sound may be used by machine learning algorithm 311 to identify other similar sounds. In some embodiments, the sound database 312 may be prioritized and/or pruned by a machine learning algorithm. In some embodiments, step 301 may be performed by the identification module 202 described with reference to FIG. 2 herein.

In step 302, the system isolates the specific sound. Generally, in step 302, the specific sound identified in step 301 is isolated from the other sounds in audio received from the audio source 210. In some embodiments, step 302 may be performed based on temporal filtering, amplitude filtering, and/or frequency filtering such as high, low, or band filtering. In some embodiments, the system may use different channels of the audio source 310 to isolate the specific sound. For example, if a large IID or ITD is present between channels of the input audio stream, one channel may be used to isolate the specific sound in another channel by subtraction or masking. In some embodiments, the specific sound may be isolated using the matching sound in the sound database 312 by subtraction or masking. In some embodiments, only approximate isolation of the specific sound is performed in step 302. In some embodiments, the specific sound may be recreated using the sounds in the sound database. For example, the playback speed, the tone, and/or the amplitude of a sound in the sound database may be modified to approximate the specific sound identified in the audio source 310. In some embodiments, step 302 may be performed by the sound filter 204 described with reference to FIG. 2 herein.

In step 303, the system generates output for the directional speaker 321. In some embodiments, the output comprises the specific sound isolated in step 302. In some embodiments, the directional speaker may be configured to perform a periodic sweep of a projection area and the directional speaker audio output may be timed to the periodic sweep. In some embodiments, the directional speaker output may further comprise projection direction data. In some embodiments, the projection direction data may be determined by the projection direction module 206 described with reference to FIG. 2. In some embodiments, the projection direction may be associated with user location. In some embodiments, the projection direction data may comprise two or more discreet projection zones associated with two or more users such that different sound may be projected to different users in the same room using one directional speaker. In some embodiments, projection direction data may associate projection angles with temporal portions of the directional speaker audio. In some embodiments, the directional speaker output may comprise a 2D soundscape to be produced by the directional speaker. In some embodiments, the directional speaker output may comprise separate audio streams for each panel of a fixed multipaneled directional speaker. In some embodiments, the directional speaker output may comprise rotation instructions for a rotor-controlled directional speaker.

In step 304, the system generates output for the nondirectional speaker 322. In some embodiments, directional speaker output may comprise the audio source 310 with the specific sound subtracted. In some embodiments, the directional speaker output may correspond to unaltered source audio. In some embodiments, the nondirectional speaker output may comprise two or more channels each corresponding to a nondirectional speaker device (e.g. left speaker, right speaker) in the hybrid speaker assembly.

In some embodiments, the steps shown in FIG. 3 may be repeated continuously for an audio stream in near real time such that the converted audio is synchronized with video playback associated with the source audio. In some embodiments, the system may pre-buffer the source audio to allow for video/audio playback synchronization. In some embodiments, the steps shown in FIG. 3 may be performed on a prerecorded audio file. In some embodiments, instead of outputting to a speaker, the generated directional speaker output and nondirectional speaker output may be stored as an audio file for playback at a later time.

FIGS. 4A and 4B are illustrations of examples of multipanel directional speakers according to some embodiments. FIGS. 4A and 4B comprise top views of the panels of a directional speaker arranged to project sound at multiple angles across a projection area 420 through modulation. In some embodiments, panels 410a-e may each comprise a parametric array configured to project a narrow spread of sound through ultrasound.

In FIG. 4A, a two-panel configuration is shown. The panels 410a and 410b are positioned at an angle relative to each other and between a nondirectional left speaker 430 and right speaker 431. The angle between the two panels may be between 170-90 degrees. The two panels 410a and 410b are configured to change the projection direction of the sound within the projection area 420 through modulating the audio output of the two panels.

In FIG. 4B, a three-panel configuration is shown. The panels 410c, 410d, and 410e are positioned at an angle towards each other and between a nondirectional left speaker 430 and right speaker 431. In some embodiments, the center panel 410d is generally parallel to a line drawn between nondirectional left 430 and right speakers 431 of a speaker assembly. The angle between each of the side panels 410c and 410e and the center panel 410d may be between 170-70 degrees. The three panels 410c-410e are configured to change the projection direction of the sound within the projection area 420 through modulating the audio output of the three panels.

In some embodiments, a hybrid speaker may comprise directional speakers in other configurations. For example, a directional speaker may comprise four or more parametric panels. In another example, a directional speaker may comprise one or more curved parametric panel. In yet another example, the directional speaker may comprise a 2D matrix of panels (e.g. 2×2, 3×3, etc.) to project sound in two axes (e.g. left-right and top-down). In some embodiments, the hybrid speaker may comprise a directional speaker driven by a mechanical rotor configured to turn and/or tilt one or more parametric arrays. The distances, proportions, and relative positions of elements in FIGS. 4A and 4B are provided for reference only and are not necessarily drawn to scale.

In some embodiments, one or more of the embodiments, methods, approaches, and/or techniques described above may be implemented in one or more computer programs or software applications executable by a processor-based apparatus or system. By way of example, such processor based apparatuses or systems may comprise a computer, entertainment system, game console, workstation, graphics workstation, server, client, portable device, pad-like device, etc. Such computer program(s) may be used for executing various steps and/or features of the above-described methods and/or techniques. That is, the computer program(s) may be adapted to cause or configure a processor-based apparatus or system to execute and achieve the functions described above. For example, such computer program(s) may be used for implementing any embodiment of the above-described methods, steps, techniques, or features. As another example, such computer program(s) may be used for implementing any type of tool or similar utility that uses any one or more of the above-described embodiments, methods, approaches, and/or techniques. In some embodiments, program code macros, modules, loops, subroutines, calls, etc., within or without the computer program(s) may be used for executing various steps and/or features of the above-described methods and/or techniques. In some embodiments, the computer program(s) may be stored or embodied on a computer readable storage or recording medium or media, such as any of the computer readable storage or recording medium or media described herein.

Therefore, in some embodiments the present invention provides a computer program product comprising a medium for embodying a computer program for input to a computer and a computer program embodied in the medium for causing the computer to perform or execute steps comprising any one or more of the steps involved in any one or more of the embodiments, methods, approaches, and/or techniques described herein. For example, in some embodiments the present invention provides one or more non-transitory computer-readable storage mediums storing one or more computer programs adapted or configured to cause a processor-based apparatus or system to execute steps comprising: rendering a computer simulated scene for display to a user, detecting an onset of a saccade that causes saccadic masking in an eye movement of the user viewing the computer simulated scene, and reducing a computing resource used for rendering frames of the computer simulated scene during at least a portion of a duration of the saccade.

While the invention herein disclosed has been described by means of specific embodiments and applications thereof, numerous modifications and variations could be made thereto by those skilled in the art without departing from the scope of the invention set forth in the claims.

What is claimed is:

1. An audio converter system comprising:
   an audio input configured to receive a source audio;
   an audio output configured to couple to a hybrid speaker comprising at least two nondirectional speakers and a directional speaker; and
   a processor configured to generate an output audio for the hybrid speaker based on the source audio by performing the steps comprising:
   identifying a specific sound in the source audio;
   isolating the specific sound from the source audio;
   generating a directional speaker output for the directional speaker of the hybrid speaker based on the specific sound; and
   generating at least two channels of nondirectional speaker output for the at least two nondirectional speakers of the hybrid speaker.

2. The system of claim 1, wherein the specific sound is identified by comparing the source audio with sounds in a sound database.

3. The system of claim 2, wherein the specific sound is identified through machine learning based on generative adversarial network (GAN) using sounds in the sound database as a learning set.

4. The system of claim 1, wherein the specific sound is identified based on sound frequency and/or amplitude difference between two or more channels of the source audio.

5. The system of claim 1, wherein the at least two channels of nondirectional speaker output is generated based on subtracting the specific sound from the source audio.

6. The system of claim 1, wherein the processor is further configured to:
   determine a projection direction for the directional speaker of the hybrid speaker based a user location, an amplitude difference between two or more channels of the source audio, and/or a time delay difference between two or more channels of the source audio.

7. The system of claim 6, wherein the projection direction for the directional speaker is outputted to the directional speaker to control a mechanical rotor configured to rotate the directional speaker.

8. The system of claim 1, wherein the directional speaker comprises a plurality of panels, and the directional speaker output comprises outputs for each of the plurality of panels.

9. The system of claim 8, wherein a projection direction of the directional speaker is controlled by modulating outputs of the plurality of panels.

10. The system of claim 1, wherein the hybrid speaker comprises a sound bar having the directional speaker positioned between a left nondirectional speaker and a right nondirectional speaker.

11. An audio conversion method comprising:
    identifying, with a processor, a specific sound in a source audio;
    isolating the specific sound from the source audio;

generating a directional speaker output for a directional speaker of a hybrid speaker based on the specific sound; and generating at least two channels of nondirectional speaker output for at least two nondirectional speakers of the hybrid speaker.

12. The method of claim 11, wherein the specific sound is identified by comparing the source audio with sounds in a sound database.

13. The method of claim 12, wherein the specific sound is identified through machine learning based on generative adversarial network (GAN) using sound in the sound database as a learning set.

14. The method of claim 11, wherein the specific sound is identified based on sound frequency and/or amplitude difference between two or more channels of the source audio.

15. The method of claim 11, wherein the at least two channels of nondirectional speaker output is generated based on subtracting the specific sound from the source audio.

16. The method of claim 11, further comprising:
determining a projection direction for the directional speaker of the hybrid speaker based on a user location, an amplitude difference between two or more channels of the source audio, and/or a time delay difference between two or more channels of the source audio.

17. The method of claim 16, wherein the projection direction for the directional speaker is outputted to the directional speaker to control a mechanical rotor configured to rotate the directional speaker.

18. The method of claim 11, wherein the directional speaker comprises a plurality of panels, and the directional speaker output comprises outputs for each of the plurality of panels.

19. The method of claim 18, wherein a projection direction of the directional speaker is controlled by modulating outputs of the plurality of panels.

20. The method of claim 11, wherein the hybrid speaker comprises a sound bar having the directional speaker positioned between a left nondirectional speaker and a right nondirectional speaker.

21. An audio system comprising:
a speaker housing;
a left nondirectional speaker and a right nondirectional speaker enclosed in the speaker housing;
a directional speaker positioned between the left nondirectional speaker and the right nondirectional speaker and enclosed in the speaker housing; and
an audio converter configured to receive a source audio, identify a specific sound in the source audio, and generate an output for the directional speaker based on the specific sound.

22. The system of claim 21, wherein the directional speaker comprises one or more parametric panels.

23. The system of claim 21, further comprising:
a mechanical rotor for controlling a projection direction of the directional speaker.

24. The system of claim 21, wherein the directional speaker comprises a plurality of panels, and wherein a projection direction of the directional speaker is controlled by modulating outputs of the plurality of panels.

25. The system of claim 21, further comprising:
a sensor for detecting a location of a user, wherein a projection direction of the directional speaker is controlled based on the location of the user.

* * * * *